United States Patent [19]

Flicstein et al.

[11] Patent Number: 4,737,232
[45] Date of Patent: Apr. 12, 1988

[54] PROCESS FOR DEPOSITING AND CRYSTALLIZING A THIN LAYER OF ORGANIC MATERIAL BY MEANS OF A BEAM OF ENERGY

[76] Inventors: Jean Flicstein, 12, Bd. du Temple, Paris 75011; Yves Nissim, 57, Quai de Dion, Bouton 92800 Puteaux; Denise Morin, 44 Rue de Coulmiers, 94130 Nogent sur Marne, all of France

[21] Appl. No.: 818,813

[22] Filed: Jan. 14, 1986

[30] Foreign Application Priority Data

Jan. 17, 1985 [FR] France ............................. 85 00654

[51] Int. Cl.⁴ ............................................. C30B 23/06
[52] U.S. Cl. .................................. 156/610; 156/612; 156/DIG. 80; 156/DIG. 103; 156/DIG. 113; 260/707; 260/DIG. 35; 427/255.6
[58] Field of Search .................... 260/707, DIG. 35; 156/610, 612, DIG. 80, DIG. 102, DIG. 103, DIG. 113; 427/70, 109, 255.6

[56] References Cited

U.S. PATENT DOCUMENTS

| | | | |
|---|---|---|---|
| 3,822,134 | 7/1974 | Rasch et al. | 427/255.6 |
| 4,231,991 | 11/1980 | Müller | 260/707 |
| 4,291,244 | 9/1981 | Beach et al. | 427/70 |
| 4,415,650 | 11/1983 | Kido et al. | 427/255.6 |
| 4,427,723 | 1/1984 | Swain | 427/53.1 |
| 4,604,294 | 8/1986 | Tanaka et al. | 427/53.1 |

FOREIGN PATENT DOCUMENTS

1105093 7/1981 Canada .
0155823 9/1985 European Pat. Off. ......... 427/255.6
60-124609 7/1985 Japan ........................ 156/DIG. 113
684677 12/1952 United Kingdom ............. 427/70

OTHER PUBLICATIONS

Luff et al., The Structure and Properties of Evaporated Polyethylene Thin Films, Thin Solid Films, vol. 6, (1970), No. 3, pp. 175-195.
Journal of Polymer Science, Part A-2, vol. 10, 1972.

*Primary Examiner*—John Doll
*Assistant Examiner*—Robert M. Kunemund
*Attorney, Agent, or Firm*—Pearne, Gordon, McCoy & Granger

[57] ABSTRACT

Process for depositing and crystallizing a thin layer of organic material by means of a beam of energy.

A compact block formed of organic material is disposed adjacent one of the faces of the substrate, the block is subjected through the substrate to the action of a laser beam, so as to desorb the organic material forming the block, the substrate being optically transparent to the beam, and a relative displacement is performed between the substrate and the beam in order to sweep such faces over a given path, to enable the desorbed material to be deposited on the face of the substrate opposite the block, and the material thus deposited to be crystallized in a quasi-crystalline form.

Application to the manufacture of integrated optical products, such as lenses, mirrors, networks and the manufacture of opto-electronic components.

7 Claims, 1 Drawing Sheet

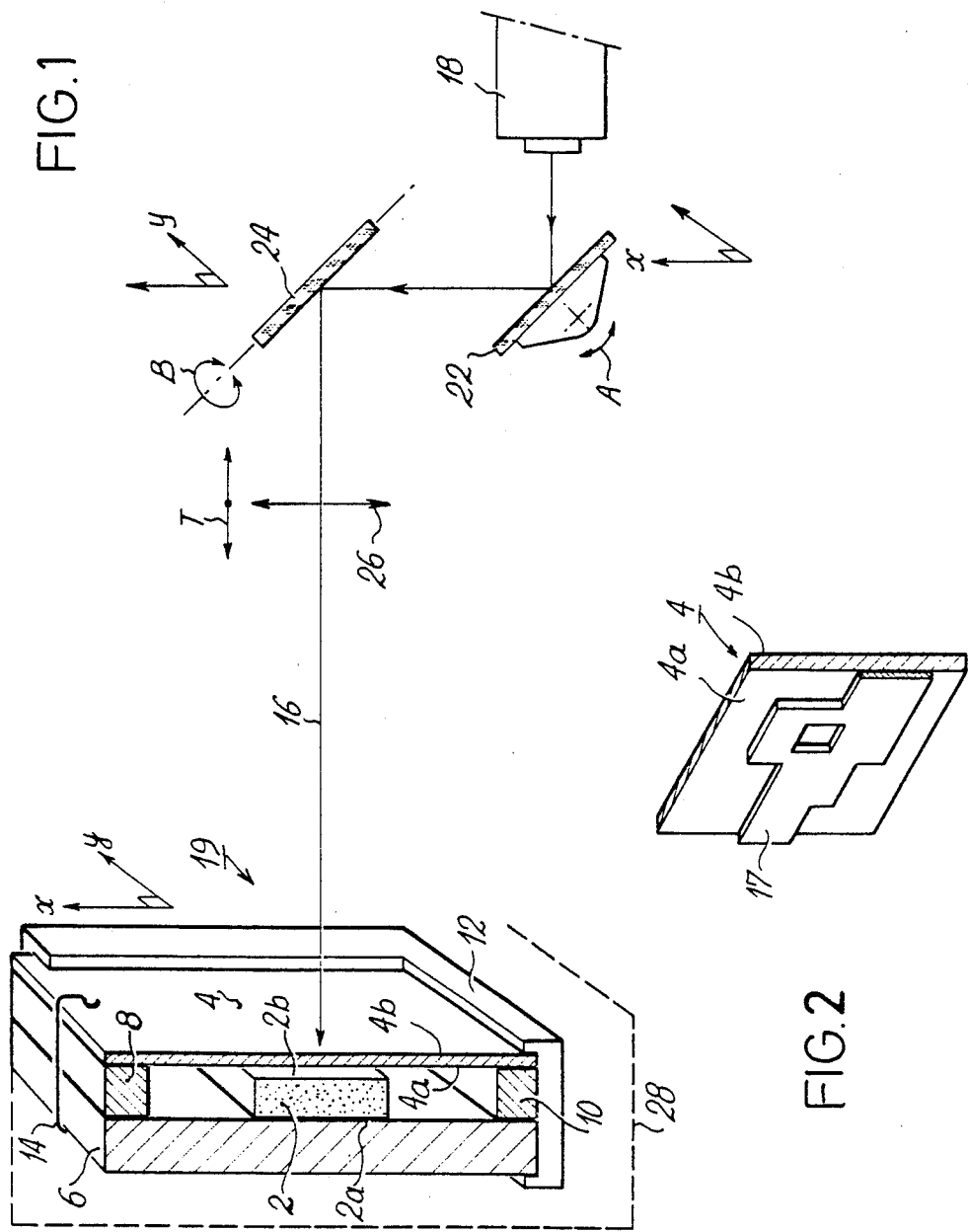

PROCESS FOR DEPOSITING AND CRYSTALLIZING A THIN LAYER OF ORGANIC MATERIAL BY MEANS OF A BEAM OF ENERGY

The invention relates to a process for depositing and cystallizing a thin layer of organic material by means of a beam of particles (energy).

It applies more particularly to fields of manufacture of integrated optical components, such as lenses, mirrors, networks, and the manufacture of opto-electronic components.

BACKGROUND OF THE INVENTION

In integrated optics, the basic element is a light guide; it is formed by a guiding layer sandwiched between two substrates having a lower refractive index than that of the guiding layer; the guiding layer can be flat and of homogeneous thickness or else have a certain configuration (drawings, motifs). The geometry of the guiding layer is a function of the subsequent use of the light guide.

At present a number of techniques are used for producing light guides of flat geometry or having a particular profile; they can be grouped into two categories.

The first category relates to the surface modification of a transparent substrate, generally of glass, silica or lithium niobate. It relates more particularly to obtaining in the substrate a refractive index modified by a diffision of ions in the substrate.

The diffusion can be formed either under the impulse of a difference in chemical potential, or following an ionic implantation or a thermal diffusion of a dopant. In the latter case it is difficult to master a gradient of ordinary index, having regard to the concentration profiles of the doping agents in the substate.

Moreover, since the number of dopants compatible with the substrates generally used is limited, the values of the difference in index which can be obtained between the diffused layer and the substrate are limited.

The ordinary index gradient can readily be mastered with ionic implanation. However, this method is complex, requiring the use of high energy ion beams and a number of stages of annealing of the substrate to remedy the damage caused by implantation.

The second category, to which the process according to the invention belongs, relates to depositing thin layers of a transparent substrate. Unfortunately, the conventional depositing methods often produce thin layers of generally mediocre optical quality.

Moreover, for the manufacture of integrated optical components and opto-electronic components, the intention is progressively growing of replacing the materials generally used, such as glass, silica or lithium niobate by organic materials, mainly for reasons of flexibility of the materials.

Research in recent years has in fact shown that numerous organic materials in a crystallized form, more particularly polymers, might have non-linear optical responses, as well as electro-opitical responses, comparable to those of the best materials normally used. We may refer more particularly to the article by J. Badan et al. entitled "Non-linear Organic Crystals: theoretical concepts, materials and optical properties", published in ACS Symposium, Series 233, 81 (1983), pages 81-107 and the article by J. Zyss entitled "A Molecular Engineering Approach Towards the Design of Efficient Organic Crystals for Three Wave Mixing", published in Current Trends in Optics, 1981, pages 123-134.

Among these organic compounds in crystallized form, a large number of intramolecular charge transfer compounds are found which have the great advantage of having an aptitude for polarization, causing an optically active behaviour of the organic material such as, for example a doubling of the frequency of the light wave arriving on such material. With these crystallized organic materials it is also possible to obtain a phase modulation based on the Pockels effect, having regard to the opto-electronic properites of certain of these organic materials and the stability of their cystalline lattice.

Having regard to these new materials, the conventional techniques for depositing a thin crystalline layer on a transparent substrate, to produce a light guide of flat geometry or having a particular design, have a certain number of specific drawbacks.

The first prior art technique for depositing a thin crystalline layer of organic material on a substrate is epitaxy on the substrate from supersaturated solutions of organic material. It is described more particularly in an article in "Optical and Quantum Electronics", 7, (1975), pages 465-473 of H. P. Weber et al. entitled "Organic Materials for integrated Optics".

A multi-component optical system—i.e., one comprising a number of components—can be produced only with difficulty by this technique, which enables thin monocrystalline layers of large surface to be obtained at a temperature close to ambient temperature. This is due to the fact that the epitaxy solvent acts at one and the same time as an intermediary and an impurity. Moreover, it is difficult to produce patterns or a layer having a particular profile.

The second method of depositing a thin crystalline layer of organic material is the method of Langmuir-Blodgett. It was described more particularly in an article in the "Journal of Non-Crystalline Solids" 47, 2 (1982), pages 159-174 by C. W. Pitt, entitled "Materials and Fabrication Techniques for Integrated Optics: organic and amorphous materials".

This method, which allows the layer-by-layer depositing of an organic monocrystalline dielectric material (so-called monomolecular layers) ensures satisfactory mastery of the total thickness of the layer of organic material deposited. Moreover, the refractive index of these organic layers can be potentially changed in a precise manner, thus readily enabling patterns and light guides of flat geometry to be obtained. Moreover, the organic layers obtained can diffuse light, this phenomenon being due to the nucleation of holes, of the same dimension as the wave length of the light received by such layers.

Unfortunately, a number of constraining elements reduce the major advantages of this method. The first element is the compulsory presence in the molecule of organic material of a solventophilic-solventophobic functional pair, more particularly a hydrophilic-hydrophobic pair, which considerably limits the number of organic materials which can be deposited by this method on a substrate; this is all the truer, if we envisage depositing organic compounds having non-linear optical responses and/or electro-optical responses.

Moreover, the experimental conditions of growth of the layer of organic material on the substrate are relatively complex, since a sub-phase, a purified atmosphere and an anti-vibratile system must be used, and parameters such as the temperature and pH of the solution, the rate of deposit of the material and the variation in pressure of the surrounding atmosphere must be strictly controlled.

A third prior art method of depositing a thin crystalline layer of an organic material is evaporation in vacuo by catholic atomization. It is more particularly described in the already quoted article by C. W. Pitt.

With this method it is difficult to control the thickness of the deposited layer to form patterns with the layer. Moreover, such deposited organic layer age poorly, such ageing being mainly connected with the presence of free projected radicals in the thin layers during their production.

A last prior art method of depositing a thin crystalline layer of organic material is thermal evaporation. It is described more particularly in the article "High Purity Organic Molecular Crystal" by N. Karl in "Crystals" No. 4, (Springer Verlag) page 65, (1980).

This technique enables thin enough, very flat crystalline layers of organic material to be obtained, whatever the chemical nature of such materials may be. Unfortunately, the main disadvantages of this technique lie in the impossibility of operating with organic materials whose vapour tension is very high and difficult to control, the need to work in vacuo, and certain difficulties in obtaining thin layers of a given profile.

In this thermal evaporation method, evaporation is generally performed from a crucible or a Knudsen cell containing the material to be deposited in pulverulent form. Controlling evaporation means that the organic material must be brought to its melting point, so that a hot furnace must be used, and the material must be kept in the molten state throughout its growth on the substrate. This causes the risk of degrading the organic materials, which are sensitive to heat, and contaminating the molten material by the crucible, due to contact between the bath and the crucible.

SUMMARY OF THE INVENTION

The invention relates precisely to a novel process which enables a thin layer of organic material to be deposited in crystalline form, while more particularly enabling the various disadvantages set front hereinbefore to be obviated. The process is based on the desorption of an organic material, induced by a beam of energy particles, at ambient temperature. By a single irradiation it allows the deposit and crystallization of a layer of organic material on a more particularly transparent substrate.

The term "substrate" is taken to mean a single material and also a stack of layers of different natures.

More precisely, the invention relates to a process for depositing and crystallizing a thin layer of an organic material on a substrate comprising two parallel faces, wherein a compact block formed of organic material is disposed adjacent one of the faces of the substrate, the block is subjected through the substrate to the action of a laser beam, so as to desorb the organic material forming the block, the substrate being optically transparent to the beam, and a relative displacement is performed between the substrate and the beam in order to sweep such faces over a given path, to enable the desorbed material to be deposited on the face of the substrate opposite the block, and the material thus deposited to be crystallized in a quasi-crystalline form.

In contrast with the prior art processes, this depositing and crystallization process can be used for a large number of organic materials and substrates, and in order to deposit strips or ribbons of materials having any pattern or profile. It also has the advantges of being very simple and quick to put into effect, and of being able to precisely control the thickness of the thin layer deposited, while operating at ambient temperature.

Moreover, the deposit of a layer of organic material in crystalline form is obtained without the need to heat the material beyond its melting point, since such heating would degrade the material.

Advantageously, the temperatures induced by the irradiation of the block of material by the beam of particles are so selected as to be lower than the melting point of the organic material.

It is known to use an energy (particle) beam to locally heat the surface of a sample to temperatures capable of inducing recrystallization in the solid or molten phase of the material. It is also known to use the energy beam of particles to replace the conventional heating sources, more particularly to allow the evaporation of a material or the fritting of ceramics.

In a preferred embodiment of the process according to the invention, the beam of particles is a laser beam which is advantageously continuous.

In another preferred embodiment of the process according to the invention, the beam of particles is delivered at the parallel faces of the substrate perpendicularly to such faces.

In another preferred embodiment of the process according to the invention, the block of organic material is obtained from a cold-compressed powder of such material.

Advantageously, the layer of organic material deposited on the substrate is annealed, to improve the cyrstalline state of the layer.

According to another preferred embodiment of the process according to the invention, the block of organic material has two faces which are parallel with one another and disposed in parallel with the parallel faces of the substrate, and as close as possible thereto. This kind of arrangement more particularly allows operations to be performed in the open air without the use of an evaporation enclosure, the organic material and the substrate having no occasion to be contaminated by the ambient atmosphere.

However, to drive off certain surrounding gases, such as oxygen, the substrate and the block of organic material can be disposed in an evacuated enclosure.

The process according to the invention has the advantage of enabling any kind of organic material to be deposited in accordance with a required motif. More particular, it can be used for depositing polymeric materials whose basic monomer is selected from styrene, methyl methacrylate, derivatives of urea, pyrrolidine, paranitroaniline, pyridine oxide and dinitro benzene.

These organic materials can advantageously be deposited on a substrate selected from glass, silica, alumina, silicon, gallium arsenide, or any other semiconductor, and methyl polymethacrylate.

BRIEF DESCRIPTION OF THE DRAWINGS

Other features and advantages of the invention will be more clearly gathered from the following non-limitative description, given merely by way of illustration, with reference to the accompanying drawings, wherein:

FIG. 1 illustrates diagrammatically a device enabling the process according to the invention to be put into effect, and FIG. 2 illustrates diagrammatically a thin layer of organic material obtained by the process according to the invention.

DESCRIPTION OF THE PREFERRED EMBODIMENTS

Referring to FIG. 1, the process of depositing and crystallizing a thin layer of an organic material consists in disposing a compact block 2, formed by the organic material to be deposited, adjacent a substrate 4 on which such material is to be deposited. The block 2, for example of parallelepipedic shape, comprises two flat faces 2a and 2b which are parallel with one another. The substrate 4, more particularly also of parallelepipedic shape, comprises two flat faces 4a and 4b which are parallel with one another. One of the flat faces of the substrate 4, for example, the face 4a, is disposed opposite one of the flat faces, more particularly face 2b, of the block of organic material 2.

Advantageously the parallel faces 2a and 2b of the block 2 of organic material are oriented in parallel with the two parallel faces 4a and 4b of the substrate 4, the faces 2b and 4a opposite the block and the substrate respectively being disposed as close as possible to one another—i.e., in the immediate proximity of one another. The block 2 of organic material can be retained in proximity to the substrate 4, for example, by attaching it, more particularly by gluing, to a supporting plate 6, such as a microscope slide. Such a support compares favourably with certain prior art processes, since it prevents the block of organic material from being contaminated by a crucible; this is more particularly due to the fact that operations are performed at ambient temperature.

Provided at the two ends of the supporting plate 6 can be shims 8 and 10, against which face 4a of the substrate 4 bears.

To prevent direct contact between the block of material 2 and the substrate 4, the shims 8 and 10 must have a thickness slightly greater than that of the block 2. The substrate 4 can be retained in position on the shims 8 and 10 by gluing, the shims themselves being glued to the support 6. The substrate can also be retained in place by means of a U-shaped member 12 or a clip 14.

The reference 19 (FIG. 1) denotes the assembly formed by the supporting plate 6, the block 2, the shims 8 and 10 and the substrate 4, which are rigidly connected to one another.

After the block 2 of organic material has been disposed opposite the substrate 4, the block 2 is subjected at ambient temperature to the action of a beam of energy particles 16, which can advantageously be a light beam, such as a, for example, continuous laser beam, emitted by a laser source. The wave length of the laser beam can lie in the infrared, the visible or the ultraviolet. After the laser beam 16 has passed right through the substrate 4, it interacts with the block 2 of organic material so as to desorb such material. It is advantageously oriented in a direction perpendicular to the parallel faces 4a and 4b of the substrate 4 and therefore of the faces 2a and 2b of the block 2 of organic material in the embodiment illustrated in FIG. 1.

To allow the desorption of the organic material forming the block 2, and more precisely the molecules of such material, by the action of the beam of particles 16, having regard to the arrangement of the various elements in relation to one another, the substrate 4 must be made from a material which is optically transparent to the beam of particles 16.

After desorption of the organic material forming the block 2, such material can be deposited on the face 4a of the substrate 4 disposed opposite the block 2 of organic material, more particularly opposite its face 2b.

To obtain the desorption of all the organic material forming the block 2 and cover all or a portion of the face 4a of the substrate, a relative displacement is carried out between the substrate 4 and the beam of particles 16, more precisely between the assembly 19 and such beam, along a plane xy parallel with the two parallel faces 4a and 4b of the substrate 4.

The relative displacement between the substrate 4 and the beam of particles 16 is so performed as to sweep the surfaces 4a and 4b of the substrate, and therefore the face 2b of the organic block, along a given path, thus enabling a thin layer 17 of organic material to be obtained, as shown in FIG. 2, which takes the form of a ribbon which is continuous or of any shape, or else takes the form of continuous or intermittent motifs; any geometry can be envisaged for the thin layer 17 of organic material.

The sweeping of the flat faces of the substrate by the laser beam 16 can be obtained by keeping the substrate or more precisely the assembly 19 fixed, and performing a sweep of the beam. In the case of a laser beam (FIG. 1) the sweeping can be formed continuously by means of the two mirrors 22 and 24 disposed in cascade. The mirror 22, adapted to rotate, as indicated by arrow A, around an axis perpendicular to the plane of FIG. 1, allows the laser beam 16 to sweep in a direction x. The mirror 24, adapted to rotate, as indicated by arrow B, around an axis lying in the plane of FIG. 1, enables the laser beam 16 to sweep in the direction y.

The faces 4a and 4b of the substrate might also be swept by the laser beam 16 by displacing the substrate in the two directions x and y via the agency of suitable mechanical means familiar to an engineer in the art, the laser beam remaining fixed.

To obtain satisfactory focusing of the beam of particles 16 on the block 2 of organic material a lens 26 can be provided which is oriented parallel with the faces 4a and 4b of the substrate. It can make a traversing movement, as indicated by arrow T, in a direction perpendicular to the plane xy.

The use of a beam of energy particle 16 allows not only the desorption of the organic material forming the block 2, but also the depositing of such material on the face 4a of the substrate 4. It also allows the crystallization of the layer of organic material 17 deposited on the face 4a of the substrate 4 in a polycrystalline form with giant monocrystalline grains (a few mm) oriented in a privileged direction.

This cystallization, which is performed at practically the same time as the sublimation of the organic material, is one of the main reasons why the process according to the invention can be applied to a large number of organic materials.

The beam of particles causes the growth of the thin organic layer over a clearly localized and controlled area, thus avoiding all the problems of the parasite nucleation process, as in the prior art processes.

To improve the crystallization of the layer 17 of organic material deposited, and more particularly with a view to obtaining a thin layer tending towards the monocrystal, an extra stage of conventional thermal annealing can be performed like, for example, annealing in a furnace, or transitory annealing by means of a laser beam or an electron beam.

The thickness of the deposited thin layer of an organic material is controlled by taking action on the power of the beam of particles 16, the speed of sweeping of the faces 4a and 4b of the substrate, and the rate of thermal evacuation thereof.

The temperatures induced by the irradiation of the block 2 or organic material by the beam of particles 16 are so selected as to be lower than the melting point of the organic material. Moreover the thermal gradient created on the substrate 4 itself, resulting from its being swept by the beam of particles 16, will facilitate the obtaining of an anisotropic deposit on the face 4a on the substrate (privileged orientation of the monocrystalline grains).

If a continuous band of organic material is to be obtained which has a special profile (FIG. 2) or separate motifs, an aspect which is particularly advantageous for the production of integrated optical components (networks, lenses), the width of the ribbons or motifs can be controlled by taking action on the dimension of the beam of particles 16. This can be done by displacing the lens 26 in the direction T (FIG. 1).

The width of the deposited ribbons or organic material (FIG. 2) also depends on the power density of the beam of particles, the speed of sweeping the faces 4a and 4b of the substrate, the proximity of the substrate and the block of material, the coefficient of adhesion of the organic material to the substrate, and the rate of thermal evacuation of the substrate.

The process disclosed hereinafter is essentially a thermal process, since the desorption of the organic material under the impact of the beam of high energy particles 16, followed by the depositing of the material on the substrate 4, is explained by a process of transfer of the energy vehicled by the beam of particles 16 into thermal energy.

The first process of energy transfer is a factor which limits the process, since the formation of an electron-hole pair by the absorption of a particle, more particularly a high energy photon by the organic material, before the transfer of energy takes place in the form of phonons, may cause the degradation of the molecules forming the organic material. By way of example, the pyridine oxide ring can be degraded by ultraviolet irradiation.

In other words, if operations are performed below the melting point of the organic material forming the block 2, a high energy light photon produces the same effect—i.e., the desorption of the material and its crystallization on the substrate—as a low energy photon irradiation transmitting its energy directly to the photons of the material.

Consequently, below the melting temperature the selection of the wave length of the beam of particles depends inter alia on the properties of absorption of the beam by the organic material.

The criterion for selecting the irradiation wave length to be used also depends on the relative arrangement of the block of material 2, the substrate 4 and the beam of particles 16, since in view of the fact that before it reaches the block of material 2, the beam of particles 16 must pass right through the substrate 4, a wave length must be selected which belongs to the range of transparency of the substrate.

Two examples of this selection of wave length will now be given by way of illustration. If the intention is to deposit a thin layer of 3-methyl-4-nitropyridine oxide having the formula:

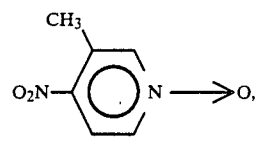

generally known by the abbreviation POM, on a substrate of glass, for example, that known under the trademark VYCOR, an argon laser beam can be used whose wave length is 514.5 nm. Similarly, if a thin layer of POM is to be deposited on a gallium arsenide substrate, a carbon dioxide laser can be used whose wave length is 10.6 μm.

The process according to the invention can be readily performed, more particularly in the open air—i.e., without using an evaporation enclosure—on condition that the block 2 of organic material is placed as close as possible to the substrate 4 on which it is to be deposited, in which case the block and the substrate have no chance of being contaminated by the surrounding atmosphere. It should be noted that the depositing of the organic material can be performed in the open air, having regard to the fact that operations are performed at ambient temperature.

However, if necessary the assembly 19 as shown in FIG. 1, can be disposed inside an evacuated enclosure 28, so as to drive off the gases, such as oxygen, which are in contact with the block 2 of organic material and/or the substrate 4. A vacuum of $10^{-6}$ —i.e., $1.33 \times 10^{-4}$ Pa—may be enough.

The process according to the invention can advantageously be applied to a large number of combinations between the block of material and the substrate, since the block 2 of organic material can be obtained by compacting the organic material which is to be deposited by the cold pressing of a fine, pure pwoder of the material, thus enabling a compact block 2 of material to be obtained which is quasi-isotropic from both the physical and chemical points of view and has a mechanical behaviour comparable to that of a monocrystal of the same material.

For example, it is possible to deposit in the form of a thin crystallized layer, organic materials such as polymers whose monomer is a derivative of pyrrolidine, such as N-4-nitrophenl prolinol having the formula

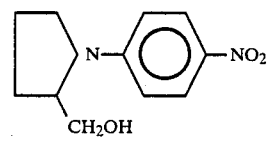

known as NPP for short, the compound also being regardable as a derivative of paranitroaniline; a derivative of paranitroaniline such as 2-methyl-4-nitroaniline, known as MNA for short; metanitroaniline, or mNA for short; urea or its derivatives; a derivative of pyridine oxide such as 3-methyl-4-nitropyridine-1-oxide, known as POm for short (formula given previously), and also a derivative of dinitro benzene such as methyl-2,4-dinitrophenylamino-propanoate having the formula:

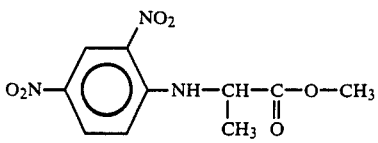

known as MAP for short.

Other derivatives of paranitroaniline which can be deposited and crystallized according to the invention have more particularly been described in an article in the Journal of the American Chemical Society, 101:18, of Aug. 29, 1979, pages 5186–5193 by H. E. Smith et al., entitled "Optically active amines. Spectral observations on chiral N-substituted p-nitroanilines".

The organic materials mentioned above have the advantage of having non-linear optical responses and also electro-optical properties. They can therefore be advantageously used for the manufacture of integrated optical components, more particularly light guides, and also for the production of electro-optical components.

Moreover POM can be used as a means of amplifying light visible or not.

Other materials which may be mentioned as being capable of being deposited in a crystalline form by the process according to the invention are polystyrene and methyl polymethacrylate; these materials are mainly used for making light guides.

Positive or negative photosensitive resins may also be quoted, which enable a mask to be made for the production of integrated electronic circuits.

These various organic materials can be deposited on a substrate which is selected mainly in dependence on the optical component to be produced. More particularly, if the intention is to integrate a number of optical components on the same substrate, it will be possible to use, for instance, glass such as that known under the trademark VYCOR, silica, silicon, gallium arsenide or any other semiconductor. Another substrate which can be used in alumina or methyl polymethacrylate.

In the manufacture of integrated optical components the selection of the substrate will be such that it has a refractive index lower than that of the deposited layer of organic material, so as to enable the latter to be used as a light guide; the layer of organic material forms the guiding layer of the light guide.

By way of example, a silica substrate can be used having a refractive index between 1.46 and 1.48, or glass manufactured by the Corning Company bearing the reference number No. 7059, whose refractive index varies between 1.43 and 1.59, on which a thin layer of POM is deposited having a refractive index of between 1.63 and 1.78.

The substrate is also selected in dependence on the adhesive properties of the organic material to the substrate.

Detailed examples will now be given showing how the process for depositing and crystallizing a thin organic layer according to the invention can be put into effect.

First of all, compact blocks of POM were prepared in the shape of a disc 13 mm in diameter and 1 mm in thickness and having a polycrystalline structure. The blocks were prepared by applying a uniaxial pressure of 5 tonnes for 15 minutes in vacuo in a pelleting mould.

This compacting process enables blocks to be obtained which have two flat faces which are parallel with one another, the surface being perfectly smooth.

Before compacting, the blocks of POM were formed from a POM powder purified by double recrystallization and filtration on activated charcoal, then crushed by a ball pulverizer in an alumina receptacle in an aqueous medium for 1 hour. The powder thus formed was then separated from the liquid medium by centrifugation, then dried under primary vacuum in a desiccator in the presence of a hydrophilic material. Then the powder was introduced into the palleting mould and then dried again for 1½ hours under primary vacuum.

In addition to drying the powder or organic material, these drying stages enable the powder to be degasified, so that it can be used directly in an evacuated enclosure.

One of the compact blocks of POM obtained was then mounted and glued on a microscope slide by means of a double-faced adhesive ribbon. A substrate of glass, commercially available as VYCOR, having the form of a small plate was fixed parallel with the flat faces of the compact block of POM. The substrate was attached to the microscope slide by means of a double-faced adhesive ribbon. An assembly of this kind enables the block of organic material and the substrate to be positioned in immediate proximity to one another; the distance separating the two flat, parallel faces opposite the substrate and the compact block of POM were of the order of several tens of microns.

The compact block of POM was then subjected to the impact of an argon laser beam having a wave length of 514.5 nm. The irradiation was performed at an incidence of 90° with a focusing of the laser beam enabling a power of the order of 0.9 W to be obtained on the compact block of POM; the size of the spot laser had a diameter of 150 μm, the focusing lens used having a focal distance of 250 mm.

The irradiation was performed by sweeping from one end to the other the flat, parallel faces of the substrate and consequently those of the block of POM laterally—i.e., along the axis y, as shown in FIG. 1. This lateral sweeping allows a continuous growth of POM on the substrate with a privileged orientation. It contributes towards obtaining a thin layer of quasimonocrystalline POM containing few grain joints, the grains being oriented in the direction x.

The sweeping speed of the laser beam was 4.1 cm per second with a rate of covering between two succesive passages of 80%, over a length of between 3 and 4 mm.

In these conditions, for a substrate temperature of 26° C., the desorption of a quantity of POM from the surface of the compact block of material was observed, as also was the deposit of the desorbed material on the substrate. The departure of this quantity of POM was indicated by the weight of the block of POM before and after irradiation, and by microscopy in polarized incident light.

It was found that right from the start of the desorption of the molecules of POM from the compact block thereof, its surface was heavily recrystallized. This recrystallization is due to the temperature gradient produced by irradiation of the block of material.

The increase in the thermal effect on the block of material, either by an increase in the incident power of the laser beam, or by a reduction in its sweeping speed, causes the risk of degrading the organic material. In the case of POM, the degradation of the material can be detected by the appearance of brown tint on the surface of the compact block of POM.

As regards obtaining a thin layer of POM on the glass substrate, microscopic analysis was carried out in incident polarized light, an experiment which enabled giant grains of crystalline material (several mm) to be demonstrated. Analysis by powder diagram with X-rays allowed only a single chemical constituent of the layer of material deposited on the substrate to be identified; the material was POM.

The same experiment as that described above was performed with a silicon substrate. The only modifications made, in contrast with the preceding example, were the use of $CO_2$ laser having a wave length of 10.6 $\mu$m, the size of the spot laser, which was 100 $\mu$m, and its power, which was 0.9 W measured on a POM block. The layer of POM deposited and crystallized on the silicon substrate was formed, as before, by giant monocrystalline grains of POM.

Clearly, a molecualr flux of POM can be obtained also be irradiating a block of that material by means of an argon laser beam having a wave length of 514.5 nm or by means of a $CO_2$ laser having a wave length of 10.6 $\mu$m.

The same experiment was performed with a gallium arsenide substrate. Equivalent results were found as regards the desorption of the molecules of POM from the block of material and its surface recrystallization. On the other hand, there was practically no deposit of this material on the gallium arsenide substrate.

This experiment indicates that the part played by the "gluing" coefficient of the organic material to the substrate, in this case POM to GaAs, is important in order to obtain a thin layer of organic material on the substrate.

The various experiments described above were also performed with the objective of drawing lines parallel with one another—i.e., the rate of covering of the successive passages of the laser beam was zero. These experiments indicated that the block of organic material had on the surface monocrystalline grains of POM oriented perpendicularly to the direction of lateral sweeping of the laser beam—i.e., oriented in the direction x.

The width of each line of POM is equivalent to the size of the spot of the laser beam. In these conditions the deposit of POM obtained on the substrate takes the form of lines parallel with one another and in a polycrystalline form.

Clearly, the above description was given merely by way of examplary explanation; any modification of the performace of the process according to the invention can be considered without exceeding the scope of the invention.

More particularly, a number of successive layers of organic material can be deposited on the same substrate by the process according to the invention, on condition that account is taken of the relative coefficients of gluing of the different materials to produce the compact block of organic material and the deposit of the different material on the substrate used. The fact is that a compact block of organic material formed by different layers of different materials can be obtained on condition that the second material to be deposited can evaporate at a temperature lower than the evaporation temperature of the first material deposited, and so on and so forth.

Moreover, an organic layer can be deposited and crystallized by using a beam of energy particles other than a laser beam. More particularly, use can be made of a beam of electrons, X-rays, ions, the use of the particular beam of particles depending mainly on the substrate used, since the latter must be transparent to the beam of particles used—i.e., allow the beam to pass through.

Similarly, a pulsed beam of particles can be used instead of a continuous beam of particles; of course, an intermittent beam of particles must provide the same density of energy per unit of surface and time as a continuous beam, and the rate of repetition of selected pulses must be high enough to ensure continuity of lateral covering during sweeping.

The beam of particles can also be delivered in a direction at an inclination to the substrate, instead of perpendicularly thereto.

What is claimed is:

1. A process for depositing and crystallizing a thin layer of an organic material on a substrate having first and second parallel faces, said deposited and crystallized material having a non-linear optical response, said process comprising the steps of:

cold-compacting a monomer powder of said organic material to provide a block of said organic material which is able to diffuse but not absorb the light of a laser beam having the characteristics set forth below;

disposing said block adjacent to and in close proximity to the first face of said substrate, said substrate and said block being maintained at ambient temperature, said subtrate being transparent to said laser beam;

providing said laser beam as a continuous laser beam, and applying said continuous laser beam to said second substrate face and through said transparent substrate to said compacted powder block, the energy and wavelength of said continuous laser beam being chosen so as to desorb the organic material forming said block, the temperatures induced by the laser on the surface of said block being lower than the melting point of the organic material forming said block; and performing a relative continuous displacement between the substrate and the laser beam in order to sweep said laser beam over determined paths on said second substrate face to enable the desorbed material from said block to be deposited as a polymer on the adjacent first face of the transparent substrate, the polymer thus deposited being crystallized in a polycrystalline form with giant monocrystalline grains, according to said paths, the sweeping of said face comprising several successive paths, the rate of covering between two successive paths being about 80%.

2. A process according to claim 1 wherein the laser beam is delivered perpendicularly to the parallel faces of the substrate.

3. A process according to claim 1 wherein the deposited layer of organic material is annealed.

4. A process according to claim 1 wherein the substrate and the block of organic material are disposed in an enclosure containing no undesired gases.

5. A process according to claim 1 wherein the block of organic material has two faces which are parallel with one another and oriented in parallel with the parallel faces of the substrate.

6. A process according to claim 1 wherein the organic material is a monomer selected from styrene methyl methacrylate, the derivatives of urea, pyrrolidine, paranitroaniline, pyridine oxide and dinitro benzene.

7. A process according to claim 1 wherein the substrate is selected from glass, silica, alumina, silicon, gallium arsenide and method polymethacrylate.

* * * * *